(12) United States Patent
Boerstler et al.

(10) Patent No.: US 6,529,084 B1
(45) Date of Patent: Mar. 4, 2003

(54) INTERLEAVED FEEDFORWARD VCO AND PLL

(75) Inventors: David William Boerstler, Round Rock, TX (US); Juan-Antonio Carballo, Austin, TX (US); Gary Dale Carpenter, Pflugerville, TX (US); Hung Cai Ngo, Austin, TX (US); Kevin John Nowka, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/974,986

(22) Filed: Oct. 11, 2001

(51) Int. Cl.⁷ .............................. H03B 5/24; H03L 7/099
(52) U.S. Cl. .............................. 331/57; 331/17; 331/34; 331/177 R; 327/156; 327/157
(58) Field of Search .............................. 331/1 A, 8, 17, 331/18, 25, 34, 57, 175, 177 R; 327/156–159; 360/51; 375/376; 455/260

(56) References Cited

U.S. PATENT DOCUMENTS 5,648,744 A * 7/1997 Prakash et al. ................ 331/11
5,668,505 A * 9/1997 Vu et al. ........................ 331/49
6,075,419 A * 6/2000 Sun et al. ...................... 331/57
6,298,448 B1  10/2001 Shaffer et al. ............... 713/322
6,353,369 B1 * 3/2002 Boerstler ...................... 331/57

OTHER PUBLICATIONS

Cho, J "Digitally–Controlled PLL with Pulse Width Detection Mechanism for Error Correction", 1997 IEEE International Solid–State Circuits Conference Digest of Technical Papers, First Editon, Feb. 1997, Publisher John H. Wuorinen, Castine, ME 04421, pp. 334–335.

* cited by examiner

*Primary Examiner*—David C. Mis
(74) *Attorney, Agent, or Firm*—Duke W. Yee; Casimer K. Salys; Stephen R. Tkacs

(57) ABSTRACT

A voltage controlled oscillator (VCO) and phase-locked loop (PLL) topologies that allow for low-voltage, high frequency, low-jitter operation are disclosed. The conventional PLL design is modified so as to bifurcate the error signal into AC and DC components. A VCO accepting AC- and DC-component control inputs adjusts its output frequency in accordance with both inputs.

23 Claims, 4 Drawing Sheets

700

800

INTERLEAVED FEEDFORWARD VCO AND PLL

CROSS REFERENCE TO RELATED APPLICATIONS

The present invention is related to a U.S. patent application entitled "Multi-mode VCO," Ser. No. 09/974,969, filed even date hereof, assigned to the same assignee, and incorporated herein by reference.

In addition, this application is related to commonly-assigned U.S. patent application Ser. No. 09/726,282, now U.S. Pat. No. 6,353,369, entitled "High-Frequency Low-Voltage Multiphase Voltage-Controlled Oscillator" and commonly-assigned co-pending U.S. patent application Ser. No. 09/726,285, entitled "Multiphase Voltage Controlled Oscillator with Variable Gain and Range," which are also incorporated herein by reference.

BACKGROUND OF THE INVENTION

1. Technical Field

The present invention is related to phase-locked loops (PLLs) and the voltage-controlled oscillators (VCOs) used in phase-locked loops. More specifically, the present invention is directed toward a VCO and PLL that separate the error/control voltages into AC and DC components, so as to prevent AC noise currents emanating from the VCO output from interfering with the DC error/control voltage determining the frequency of the VCO.

2. Description of Related Art

A high frequency voltage controlled oscillator (VCO) is extremely important for applications such as processor clock generation and distribution, wired and wireless communication, system synchronization and frequency synthesis. Research on VCOs for the past decade has been concentrated in the areas of raising the frequency, reducing jitter, lowering the operating voltage and power, and increasing the frequency tuning range. Often these design goals are achieved only at the expense of some or all of the other performance objectives.

High frequency analog VCOs operating with current sources may have signal amplitudes that are only a small fraction of the supply voltage, severely limiting their usefulness. Current starved ring oscillators using three or four levels of cascading have become quite common, but they are extremely noise sensitive because of their very high gain, are inherently nonlinear (especially near cutoff where they often stop oscillating), are sensitive to fabrication process and operating environments, and exhibit excessive jitter characteristics. Delay interpolating oscillators are capable of very low jitter due to low gain and low noise sensitivity, but they are inherently limited in frequency range and are difficult to build in less than four levels. Multiphase oscillators offer advantages by pipelining operations using equally spaced phases at lower frequencies, but control mechanisms in delay interpolators introduce offsets from the ideal phase spacing. Inductive-capacitive (LC) oscillators are capable of high frequency and extremely low jitter but are difficult to integrate and model, and also have tuning ranges of only a few percent.

An interleaved oscillator structure described in co-pending U.S. patent application Ser. No. 09/726,282, entitled "High-Frequency Low-Voltage Multiphase Voltage-Controlled Oscillator" and co-pending U.S. patent application Ser. No. 09/726,285, entitled "Multiphase Voltage Controlled Oscillator with Variable Gain and Range" eliminates many of the problems described above. This oscillator structure, however, is limited in its application, since the topology generates noise currents. These noise currents prevent the oscillator structure from being used in conventional phase-locked loop (PLL) clock generators for low jitter applications. Therefore, a VCO topology and PLL implementation that exhibit the advantages of the aforementioned interleaved VCO topology, but that allow for low-jitter operation are needed.

SUMMARY OF THE INVENTION

The present invention provides voltage controlled oscillator (VCO) and phase-locked loop (PLL) topologies that allow for low-voltage, high frequency, low-jitter operation. The conventional PLL design is modified so as to bifurcate the error signal into AC and DC components. A VCO accepting AC- and DC-component control inputs adjusts its output frequency in accordance with both inputs.

In a preferred embodiment, the VCO utilizes a multiphase interleaved feedforward topology, wherein the feedforward paths are bifurcated into a low AC-impedance path and a DC path. The low AC-impedance path is controlled by the AC-component control input, and the DC path is controlled by the DC-component control input. In this way, AC noise currents are prevented from interfering with the DC control voltage and operating point of the oscillator.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
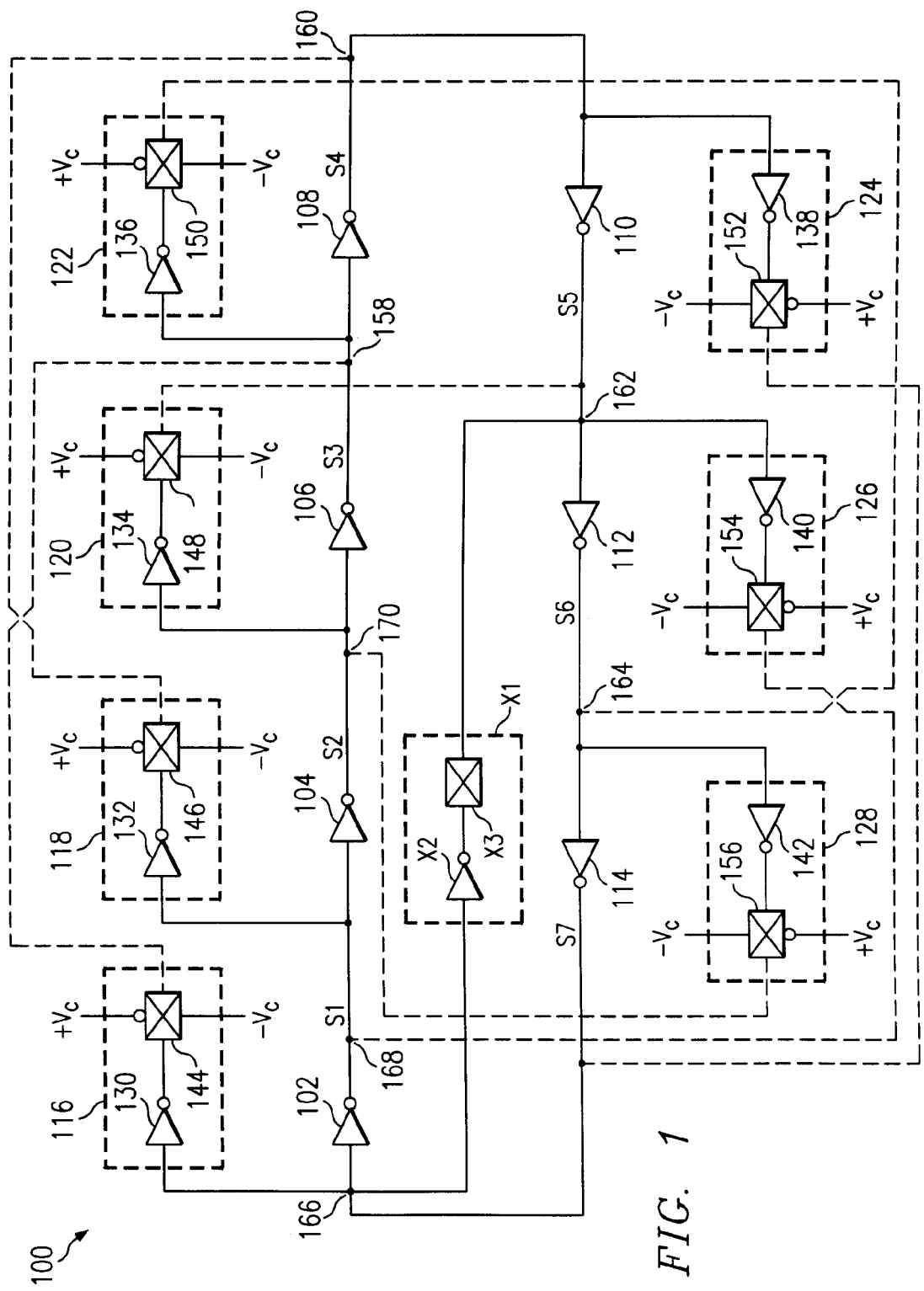
FIG. 1 is a schematic diagram of a seven-stage interleaved multiphase voltage-controlled oscillator.

FIG. 1 is a high frequency low voltage multiphase voltage controlled ring oscillator in accordance with co-pending U.S. patent application Ser. No. 09/726,282, entitled "High-Frequency Low-Voltage Multiphase Voltage-Controlled Oscillator" and co-pending U.S. patent application Ser. No. 09/726,285, entitled "Multiphase Voltage Controlled Oscillator with Variable Gain and Range," which are incorporated herein by reference. In this example, interleaved ring oscillator 100 includes seven inverter amplifiers in the form of inverter elements, 102, 104, 106, 108, 110, 112, and 114, each inverter element providing both loop delay and amplification functions. The inverter elements form a main loop for interleaved ring oscillator 100. Additionally, control elements 116, 118, 120, 122, 124, 126, and 128 are present within interleaved ring oscillator 100 in a feed forward configuration, whereby individual control elements are connected in functional parallel with two or more inverting elements. In FIG. 1, interleaved ring oscillator 100 contains seven stages S1, S2, S3, S4, S5, S6 and S7. Included in each stage is an inverter element and a control element. For example, stage S1 contains inverter element 102 and control element 116 and stage S2 contains inverter element 104 and control element 118.

The control elements are composed of two parts, including inverter amplifiers as control inverters 130, 132, 134, 136, 138, 140, and 142 along with attenuating transmission gates 144, 146, 148, 150, 152, 154, and 156. In the depicted examples, each of the control elements in interleaved ring oscillator 100 bypasses three of the inverter elements. For example, control element 116 will receive an input and generate a feed forward output that bypasses inverter elements 102, 104, and 106. As embodied, the polarity of each bypassed element matches that of the combined inverter elements being bypassed. For example, the path through inverter elements 102, 104, and 106 and the path through control inverter 130 and transmission gate 144 produce a polarity matching net inversion of the input signal on node 166.

In these examples, the transmission gate may be formed using a pair of field effect transistors in which one field effect transistor is a P channel field effect transistor and the other field effect transistor is an N channel field effect transistor. Each of the transmission gates is operated in an analog fashion in which analog voltages for +Vc and −Vc are applied to the transmission gates. The voltages may be varied to create a differential voltage. This differential voltage is a control voltage that may vary between an upper voltage in which the transmission gate is on and a lower voltage in which the transmission gate is off. Differential voltages in between the upper voltage and the lower voltage cause the transmission gate to be partially turned on.

Each control inverter and transmission gate forms a control path. For low control voltage, a transmission gate, for example, transmission gate 144, is not conducting and the effect of the output from the control inverter, for example, control inverter 130, is not apparent. By varying the voltage applied to the transmission gates, the output of each of the control elements may be varied proportionately to contribute signals at nodes within the main ring. As the control voltage increases, the effect of the control element become a proportionally greater to the net signal on the affected node. For example, for a signal at the input of inverter element 102, with the control voltage low, the signal will appear at node 158 after incurring a delay through inverter elements 102, 104 and 106. However, with the control voltage at control element 116 high, the composite or net voltage at node 158 increases faster due to the contribution of the feed forward path created by control inverter 130 and transmission gate 144. The net voltage at node 158 is obviously affected by the actual output impedances of the devices feeding node 158, namely, inverter 106 and control element 116. The effect on the loop is to introduce phase lead, to shift the loop phase distribution, and to increase the loop oscillation frequency. Maximum frequency limits occur with maximum control voltage.

Thus, if the transmission gates are all turned off, then interleaved ring oscillator 100 operates as a normal oscillator containing the seven inverting elements 102, 104, 106, 108, 110, 112, and 114. This condition generates minimum frequency in the loop. If all of the transmission gates are fully on, the upper frequency limit is generated in interleaved ring oscillator 100. By varying the differential voltage to the transmission gates, different frequencies between the upper and lower frequency limits may be generated in interleaved ring oscillator 100.

As the transmission gate on each control element is varied, the propagation speed of the loop oscillation changes proportionally. The delay through each stage S1–S7 is effectively interpolated among each parallel composite of one control element and three delay elements within the loop. If all of the transmission gates are commonly controlled, the interleaving tends to distribute the interpolation uniformly over the ring, allowing a balanced duty cycle and phase linearity.

In the depicted example of FIG. 1 the 360 degrees of phase are staggered in equal increments around the loop at nodes 158, 160, 162, 164, 166, 168 and 170. The individual node signals may be buffered and distributed for multiphase applications. If the control elements are operated independently, i.e. using separate and distinct ±Vc signals for each of the control elements, the node phases may be selectively adjusted, though this is generally not desirable. Likewise, timed disabling of selected transmission gates modulates the asymmetric phase distribution about the loop in synchronous relationship thereto.

Other ring sizes and control paths may be used if the Barkhausen criterion (n×360 phase shift and gain >1) and polarity rules are followed (polarity of control element matches the net polarity of the bypassed delay elements). The Barkhausen criterion states that the gain must be greater than one for the loop and the total phase shift has to be an integer multiple of 360 degrees for oscillation to be sustained. Polarity must be correct to meet the phase shift criterion (e.g., an inverting control element must provide a feed forward signal to an odd number of inverting delay elements in the main loop). The delay and control elements may, as in FIG. 1, be inverting elements such as inverting logic gates (inverters, tied-input NANDs or NORs, etc.) or inverting amplifiers. One of ordinary skill in the art will appreciate, however, that other "non-inverting" devices may be used, provided that the net phase shift over the desired frequency range satisfies the Barkhausen criterion.

Figure 2:
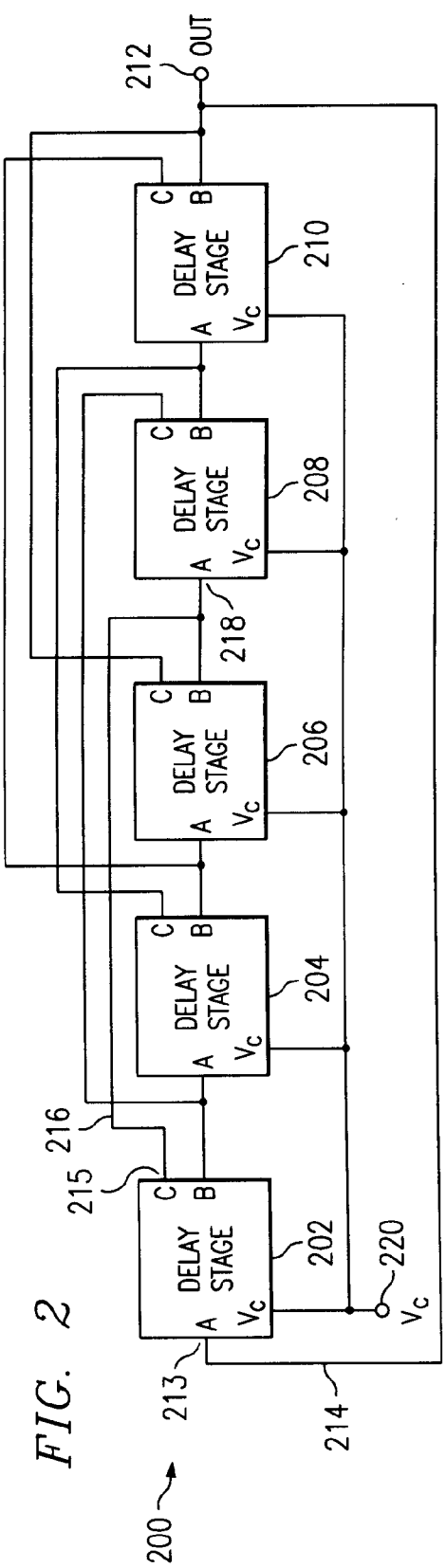
FIG. 2 is a block diagram of a five-stage oscillator of the type depicted in FIG. 1.

FIG. 2 is a block diagram of a five-stage voltage-controlled oscillator (VCO) 200 of a type depicted in FIG. 1. VCO 200 comprises five delay stages (202, 204, 206, 208, and 210) connected in a ring, with signal output 212 being fed back into input 213 of stage 202 through feedback connection 214.

Each delay stage for instance, delay stage 202, has a control output 215, which is fed into the input of another delay stage, in this case input 218 of delay stage 208. Control voltage 220 is connected to each of delay stages 202, 204, 206, 208, and 210 and controls the frequency at which oscillator 200 oscillates.

Figure 3:
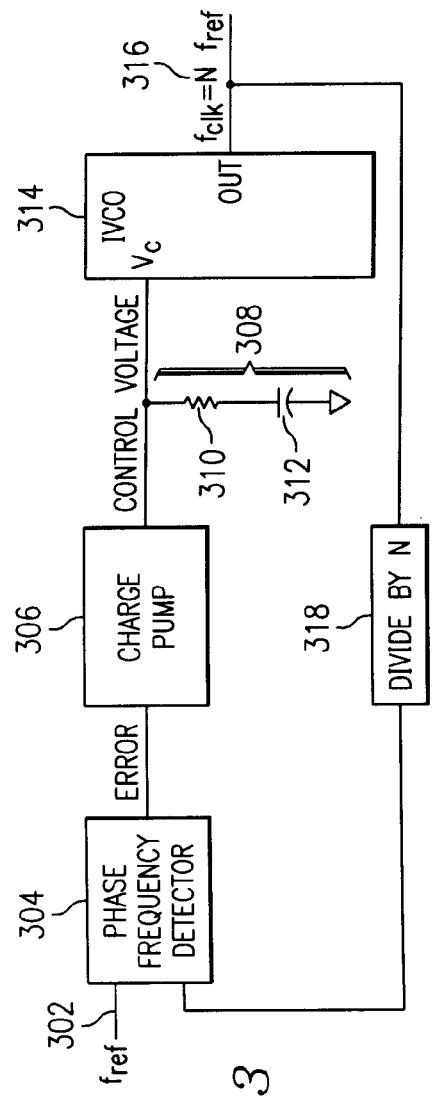
FIG. 3 is a block diagram of a phase-locked loop utilizing an oscillator as described by FIGS. 1 and 2.

Oscillator 200 may be utilized in a phase-locked loop (PLL), as depicted in FIG. 3.

FIG. 3 is a block diagram of a conventional phase-locked loop that may utilize an oscillator as described by FIGS. 1 and 2. The input to the phase locked loop is reference frequency 302, which is fed into phase detector 304. The other input to the phase detector will be discussed below. The output of phase detector 304 is fed into charge pump 306. (It should be noted that many, but not all PLLs include charge pumps; some simply couple the phase detector directly to the low-pass filter.) The charge pump creates a current for the period of time during which the phase error exists. This signal is filtered through low-pass filter 308 to obtain a voltage Vc, which is fed into voltage controlled oscillator (VCO) 314. The low-pass filter 308 shown is made up of a resistor 310 and capacitor 312 together in series, but placed in shunt with the output of charge pump 306. Various higher-order filters may be used, but low-pass filter 308, as depicted, provides the basic building block for higher order filters. The significance of low-pass filter 308's structure will be discussed shortly.

VCO 314's output (316) is the frequency output from the circuit and equals $N*f_{ref}$. This signal is fed into frequency divider 318 that divides $f_{clk}$ by N, which is an integer value in the range of 1, 2, ..., $N_1$. The output of frequency divider 318 equals $f_{clk}/N$ at steady-state and this is the second input to phase detector 304. This completes the feedback loop. Since both inputs to phase detector 304 equal $f_{clk}/N$, any shift in one of these frequencies will be detected by phase detector 304 and feed through charge pump 306 to voltage controlled oscillator 314. This results in $f_{clk}$ being adjusted to bring it back into sync to a value $N*f_{ref}$. This in sync condition is known as being "in lock," hence the name phase-locked loop.

At steady-state, one skilled in the art will recognize that the voltage Vc will be a DC constant. For instance, when a PLL is used as a frequency synthesizer, Vc will largely stay constant. The low-pass filter of a PLL is therefore designed to block out spurious AC signals that may corrupt Vc.

In many cases, however, the reference voltage will vary over time. One commonly encountered situation where this occurs is when a PLL is used to demodulate frequency-modulated (FM) radio signals. In an FM radio signal, the frequency of the signal is constantly changing. Thus, there is a need to be able to rapidly re-obtain lock.

The structure of low-pass filter 308 addresses these dual concerns. Capacitor 312 drains away high-frequency signal components to ground, thus spurious AC signals are prevented from reaching VCO 314. Capacitor 312 by itself, however, makes for a rather unstable system, and particularly so because it is coupled to charge pump 306. Instantaneous changes in the reference frequency can result in ringing at a lone shunt capacitor. This translates into a slower lock, since the ringing must die down before a stable lock is established. Thus, resistor 310 is placed in series with capacitor 312 to provide a damping effect. This damping reduces the degree and length of ringing, so that lock may be more rapidly obtained.

There is a problem with this design, however, in that VCO 314 may, through parasitic effects for example, inject some of the oscillator output 316 into Vc. If this happens, a ripple voltage developed across resistor 310 may cause fluctuations on Vc, which produce excess jitter. In particular, the oscillator design described in FIGS. 1 and 2 can inject oscillator output into Vc through parasitic effects, as shown in FIG. 4.

Figure 4:
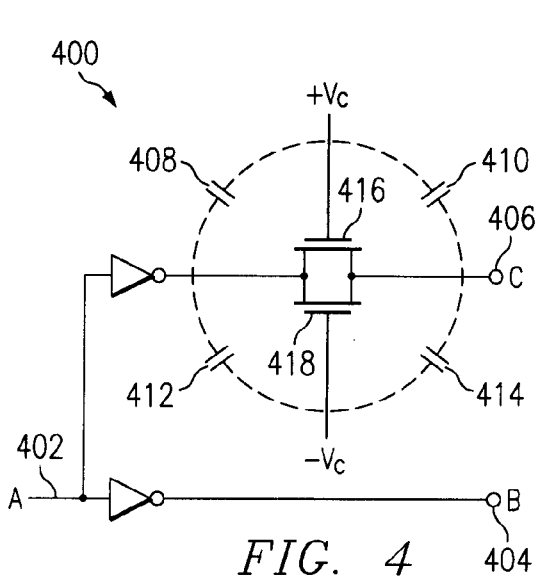
FIG. 4 is a schematic diagram of a delay stage in accordance with the oscillator type described in FIGS. 1 and 2.

FIG. 4 is a schematic diagram of a delay stage (400) in accordance with the oscillator type described in FIGS. 1 and 2. Terminals 402 and 404 are connection points along the primary path of the oscillator loop. Terminal 406 represents the end of the control path for stage 400. Mosfets 416 and 418 make up a transmission gate in control path, with the gates of mosfets 416 and 418 acting as positive and negative Vc inputs.

At high frequencies, mosfets 416 and 418 begin to exhibit capacitive behavior, as though capacitors connected the gate of each mosfet with the source and drain. These "parasitic" capacitances are shown in the figure as parasitic capacitors 408, 410, 412, and 414. Because capacitors pass AC signals, the oscillator signal running from source to drain through mosfets 416 and 418 may "pass through" parasitic capacitors 408, 410, 412, and 414, thus interfering with the control voltage Vc being applied to the gates of mosfets 416 and 418 if a resistor of non-negligible impedance exists at node Vc. This undesired AC variation around Vc is exactly the sort of interference that may cause additional jitter, as was discussed above with respect to FIG. 3.

The present invention aims to do away with this interference so that lock may be maintained even under extreme operating conditions. Moreover, the present invention is particularly useful because it provides a solution that may be readily incorporated into a monolithic integrated circuit. For example, when designing VHF or UHF radio equipment using discrete components, it is customary to install ferrite beads on transistor leads to counteract these parasitic effects. Inductors such as ferrite beads, however, are not practical to implement in a monolithic integrated circuit, so a different approach is needed.

Figure 5:
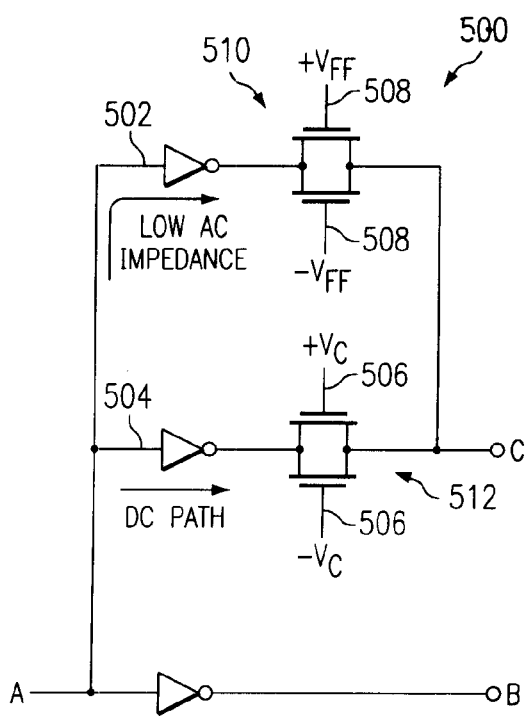
FIG. 5 is a schematic diagram of a delay stage in accordance with a preferred embodiment of the present invention.

FIG. 5 is a schematic diagram of a delay stage in accordance with a preferred embodiment of the present invention. The control path in FIG. 5 is bifurcated into a low impedance AC path (502) and a DC path (504). For example, the components on low impedance AC path 502 may be selected to exhibit high capacitance for high-frequency operation and low resistance, while the components on DC path 504 are selected to exhibit low or zero resistance for low sensitivity to parasitic noise currents and large capacitance which aids in setting the DC operating point and which aids in integrating or smoothing the effect of noise currents.

The control signals are also bifurcated into a control voltage Vc (506) and a "feedforward voltage" Vff (508). As will be seen in subsequent figures, Vc 506 represents a DC component of the error voltage from the phase detector, and Vff represents an AC component of the error voltage. Further the transmission gates (510 and 512) or other components can be selected so as to attenuate the signal in low impedance AC path 502 of the signal in relation to the signal in DC path 504. Such attenuation preserves the low-pass characteristic of the control voltages while still allowing for a quick lock following instantaneous changes in frequency. Selecting transistors with narrower width to use in low impedance path AC 502, for instance, is one way to accomplish this attenuation.

Figure 6:
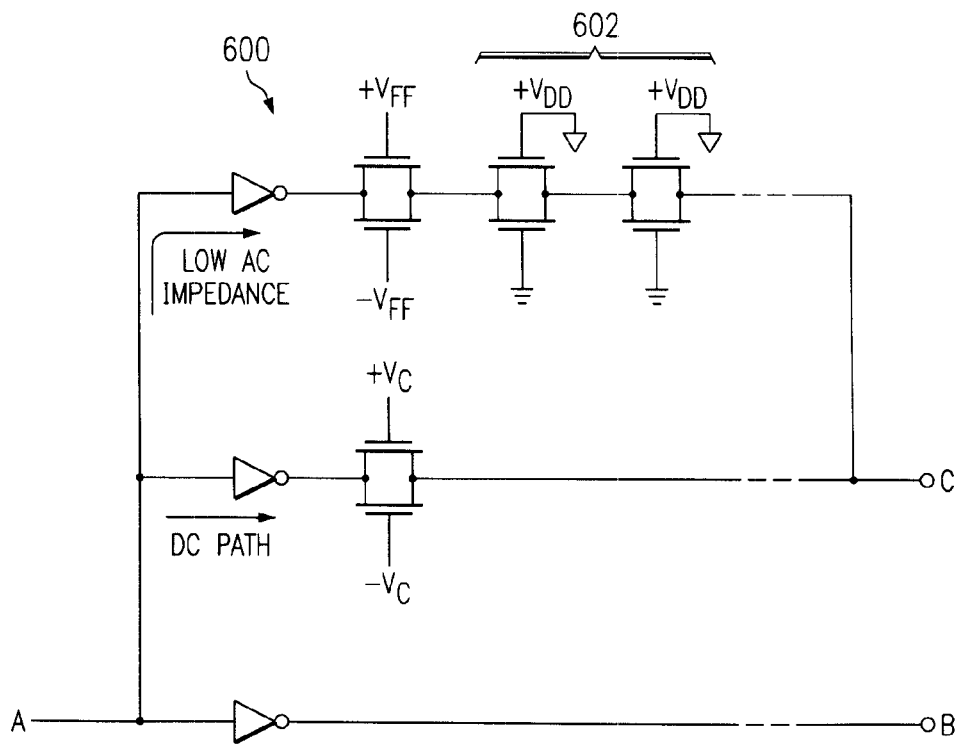
FIG. 6 is a schematic diagram of a delay stage utilizing multiple attenuating devices in the low AC-impedance path in accordance with a preferred embodiment of the present invention.

Another method that may be used independently or in conjunction with using narrow transistors is shown in FIG. 6. FIG. 6 is a schematic diagram of a delay stage (600) utilizing multiple attenuating devices in the low impedance AC path in accordance with a preferred embodiment of the present invention. Delay stage 600 includes additional attenuating devices 602 on the low impedance AC path. In FIG. 6, additional transmission gates with gate leads tied to the power supply rails are used as attenuating devices. Alternatively, one could tie the additional gate leads to +/-Vff, or one could use different attenuating components than the transmission gates depicted with similar results.

Figure 7:
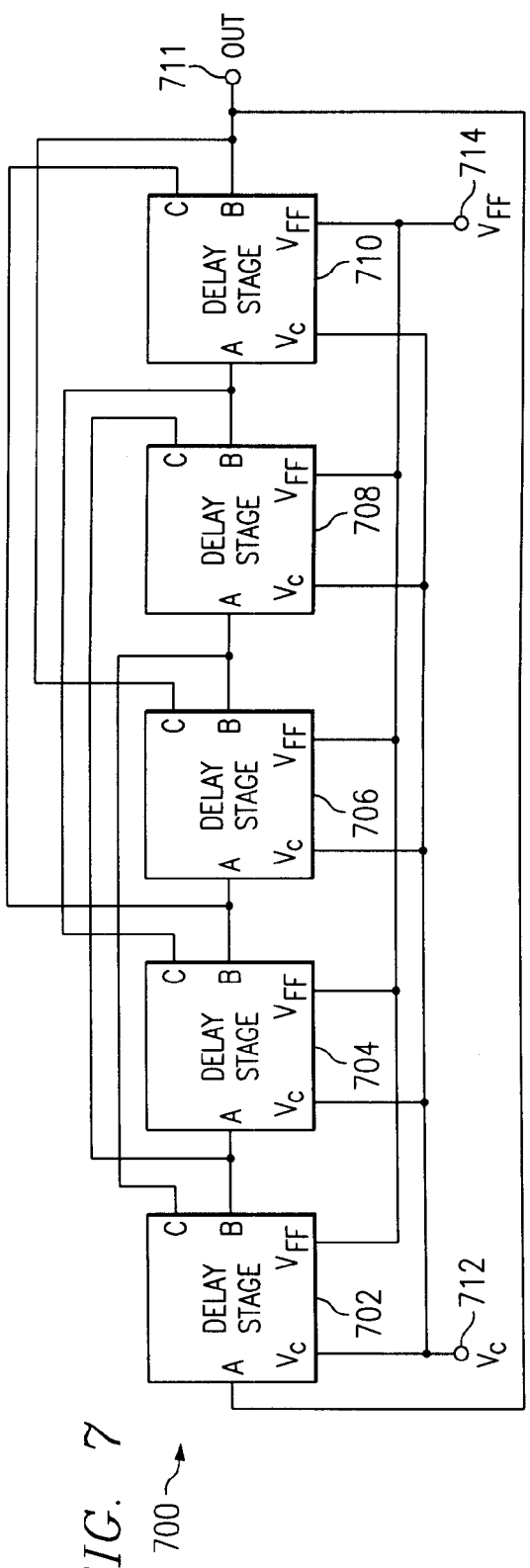
FIG. 7 is a block diagram of a five-stage voltage-controlled oscillator in accordance with a preferred embodiment of the present invention.

Combining stages results in an oscillator such as that depicted in FIG. 7. FIG. 7 is a block diagram of a five-stage voltage-controlled oscillator (700) in accordance with a preferred embodiment of the present invention. Stages 702, 705, 706, 708, and 710 form a ring, with terminal 711 acting as the output of the oscillator. The control voltage inputs of each stages are tied into a single Vc terminal (712). Similarly, the feedforward voltages are tied to a single Vff terminal (714).

Figure 8:
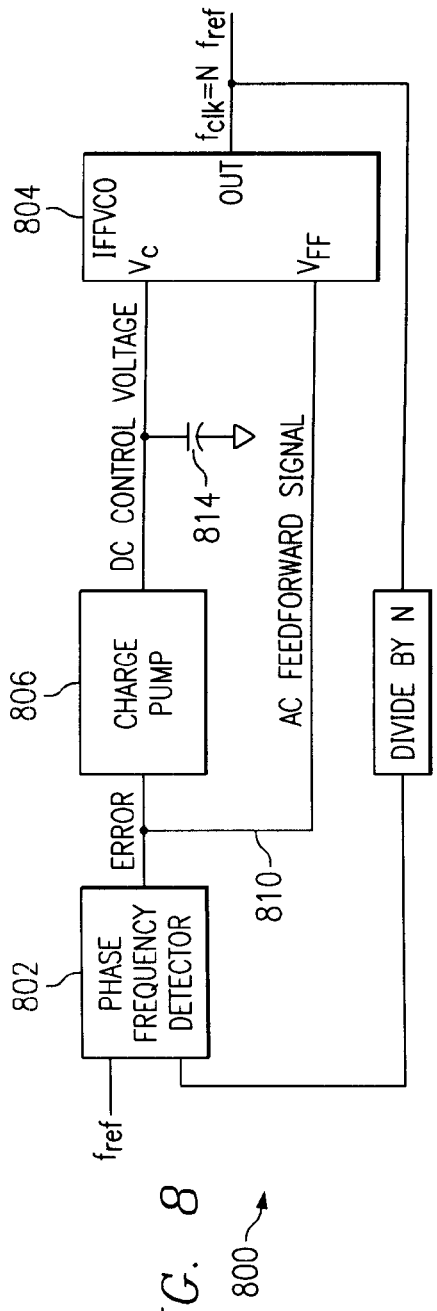
FIG. 8 is a block diagram of a phase-locked loop in accordance with a preferred embodiment of the present invention.

Oscillator 700 can then be used in a modified PLL designed to prevent control voltage drift. FIG. 8 is a block diagram of a phase-locked loop (800) in accordance with a preferred embodiment of the present invention. Rather than having the entirety of the error signal pass through charge pump 806, a phase frequency detector (802) provides a low source-impedance AC component of the error signal which passes through a low AC-impedance feedforward path 810 directly to VCO 804 through the corresponding Vff input (VCO 804 is constructed in accordance with FIGS. 5–7). A DC component is created through charge pump 806 and capacitor 814 to establish the control voltage Vc, which is fed into VCO 804.

Having an AC component of the error signal bypass the charge pump and low-pass filter eliminates the need for a damping resistor in the low-pass filter to accommodate instantaneous frequency changes. This eliminates the impedance in the low-pass filter that made possible the potential for noise voltage introduced into node Vc. Also, by separating the DC and AC components of the error signal, AC interference between input and output of the VCO is not allowed to affect the DC control voltage.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. An oscillator system comprising:
   a loop including a plurality of delay elements, wherein the delay elements are connected so as to sustain oscillation in the loop; and
   at least one feedforward element connected in parallel with at least two of the delay elements to maintain phases of signals passing through the at least one feedforward element and the delay elements at element connections in the loop, so that oscillation is sustained in the loop,
   wherein the at least one feedforward element comprises a low impedance AC path and a DC path, and
   wherein the low impedance AC path and the DC path are connected in parallel.

2. The oscillator system of claim 1, wherein the DC path includes controls for regulating signal transmission through the DC path in response to at least one control voltage.

3. The oscillator system of claim 2, wherein the controls adjust the phases of signals at element connections in the loop.

4. The oscillator system of claim 2, wherein the controls adjust an oscillation frequency.

5. The oscillator system of claim 1, wherein the DC path includes at least one attenuating circuit element that attenuates a signal flowing through the DC path.

6. The oscillator system of claim 5, wherein the at least one attenuating circuit includes a transmission gate.

7. The oscillator system of claim 5, wherein the at least one attenuating circuit includes a transistor.

8. The oscillator system of claim 1, wherein the low impedance AC path includes controls for regulating signal transmission through the low impedance AC path in response to at least one control voltage.

9. The oscillator system of claim 8, wherein the controls adjust the phases of signals at element connections in the loop.

10. The oscillator system of claim 8, wherein the controls adjust an oscillation frequency.

11. The oscillator system of claim 1, wherein the low impedance AC path includes at least one attenuating circuit element that attenuates a signal flowing through the low impedance AC path.

12. The oscillator system of claim 11, wherein the at least one attenuating circuit includes a transmission gate.

13. The oscillator system of claim 11, wherein the at least one attenuating circuit includes a transistor.

14. The oscillator system of claim 1, wherein the delay elements include amplifiers.

15. The oscillator system of claim 14, wherein the amplifiers include inverting amplifiers.

16. The oscillator system of claim 1, wherein the delay elements include digital logic gates.

17. The oscillator system of claim 16, wherein the digital logic gates include one of an inverter, a NOR gate, and a NAND gate.

18. A phase-locked loop comprising:
    a phase detector;
    a low-pass filter connected through a primary path to an output of the phase detector; and
    a voltage-controlled oscillator including a control voltage input and a feedforward input,
    wherein the control voltage input is connected to an output of the low-pass filter, the feedforward input is connected through a feedforward path to the output of the phase detector, and an output of the voltage-controlled oscillator is connected through a feedback path to an input of the phase detector.

19. The phase-locked loop of claim 18, wherein the primary path includes a charge pump.

20. The phase-locked loop of claim 18, wherein the primary path includes an amplifier.

21. The phase-locked loop of claim 18, wherein the feedback path includes a frequency divider.

22. The phase-locked loop of claim 18, wherein the low pass filter includes a capacitor.

23. The phase-locked loop of claim 22, wherein the capacitor is connected in shunt with the control voltage input.

* * * * *